(12) United States Patent
Tada

(10) Patent No.: US 11,430,250 B2
(45) Date of Patent: Aug. 30, 2022

(54) SENSOR AND SENSOR-EQUIPPED DEVICE

(71) Applicant: Japan Display Inc., Tokyo (JP)

(72) Inventor: Kenshi Tada, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/108,677

(22) Filed: Dec. 1, 2020

(65) Prior Publication Data
US 2021/0081637 A1  Mar. 18, 2021

Related U.S. Application Data

(63) Continuation of application No. PCT/JP2019/020780, filed on May 24, 2019.

(30) Foreign Application Priority Data

Jun. 1, 2018  (JP) .............................. JP2018-106156

(51) Int. Cl.
G06V 40/13 (2022.01)
G06F 3/044 (2006.01)
(Continued)

(52) U.S. Cl.
CPC .......... G06V 40/1306 (2022.01); B32B 7/025 (2019.01); B32B 27/00 (2013.01);
(Continued)

(58) Field of Classification Search
CPC .. B23B 7/025; B32B 7/04; B32B 7/05; B32B 7/12; B32B 27/00; B32B 27/34;
(Continued)

(56) References Cited

U.S. PATENT DOCUMENTS 3,935,485 A * 1/1976 Yoshida ................ H01G 7/023
310/800
2011/0310020 A1 12/2011 Wu et al.
(Continued)

FOREIGN PATENT DOCUMENTS

JP    H0659270 A  *  3/1994
JP    H07191339 A  *  1/1995
(Continued)

OTHER PUBLICATIONS

JP-2012003768-A Translation (Year: 2021).*
(Continued)

Primary Examiner — Timothy J Thompson
Assistant Examiner — John B Freal
(74) Attorney, Agent, or Firm — K&L Gates LLP

(57) ABSTRACT

According to one embodiment, a sensor includes a panel. The panel includes a cell having a detection surface and a non-detection surface, and a support substrate formed of resin and bonded to the non-detection surface of the cell. The cell includes an insulating substrate formed of resin and having a first surface and a second surface, a first protective layer facing the second surface of the insulating substrate, and a sensor electrode disposed between the insulating substrate and the first protective layer. A thickness of the support substrate is greater than a thickness of the insulating substrate, and is greater than a thickness of the first protective layer.

18 Claims, 13 Drawing Sheets

(51) Int. Cl.
*G06F 3/041* (2006.01)
*H05K 1/02* (2006.01)
*B32B 7/025* (2019.01)
*B32B 27/00* (2006.01)

(52) U.S. Cl.
CPC ........ *G06F 3/0446* (2019.05); *G06F 3/04164* (2019.05); *G06V 40/1329* (2022.01); *H05K 1/02* (2013.01); *G06F 2203/04107* (2013.01)

(58) Field of Classification Search
CPC .... G06F 3/0446; G06F 3/041; G06F 3/04164; G06F 3/0354; G06F 3/0202; G06F 2203/04107; G06F 2203/04102; G06V 40/1306; G06V 40/1329; H05K 1/02; H05K 1/0215; H05K 1/0216; H05K 1/0218; H05K 1/0219; H05K 1/028; H05K 1/0281; H05K 1/0296; H05K 1/0298; H05K 1/0393; H05K 1/05; H05K 1/11; H05K 1/111; H05K 1/117; H05K 1/118; H05K 1/119; H05K 1/14; H05K 1/141; H05K 1/144; H05K 1/147; H05K 2201/0145; H05K 2201/0154; H05K 2201/04; H05K 2201/049; H05K 2201/05; H05K 2201/07; H05K 2201/0723; H05K 2201/09218; H05K 2201/09281; H05K 2201/1051; H05K 2201/10053; H05K 2201/10166
See application file for complete search history.

(56) References Cited

U.S. PATENT DOCUMENTS

2014/0043292 A1* 2/2014 Hashimoto ........... G06F 3/0446
                                                            345/174
2014/0160695 A1* 6/2014 Jeong .................. G02F 1/13452
                                                            361/749
2014/0333328 A1   11/2014 Nelson et al.

FOREIGN PATENT DOCUMENTS

| JP | H07191339 A | * | 7/1995 | .......... G06F 3/0202 |
| JP | 2012-003768 A | | 1/2012 | |
| JP | 2012003768 A | * | 1/2012 | .......... G06F 3/0202 |
| JP | 2013-152561 A | | 8/2013 | |
| JP | 2015-114801 A | | 6/2015 | |
| JP | 2015-201164 A | | 11/2015 | |

OTHER PUBLICATIONS

JP-H0659270-A Translation (Year: 2021).*
JP-H07191339-A Translation (Year: 2021).*
International Search Report issued in connection with International Application No. PCT/JP2019/020780, dated Aug. 20, 2019.

* cited by examiner

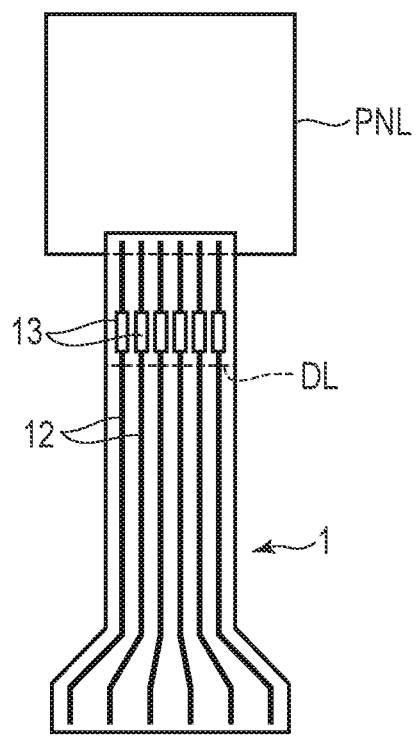
F I G. 17
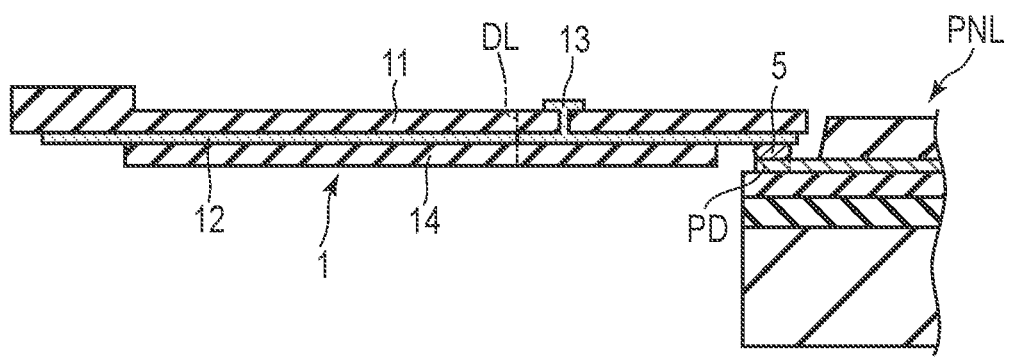
F I G. 18

SENSOR AND SENSOR-EQUIPPED DEVICE

CROSS-REFERENCE TO RELATED APPLICATIONS

This application is a Continuation Application of PCT Application No. PCT/JP2019/020780, filed May 24, 2019 and based upon and claiming the benefit of priority from Japanese Patent Application No. 2018-106156, filed Jun. 1, 2018, the entire contents of all of which are incorporated herein by reference.

FIELD

Embodiments described herein relate generally to a sensor and a sensor-equipped device.

BACKGROUND

Recently, various sensors have been developed. As the sensor, for example, a sensor which detects a pattern of ridges on a surface of a finger (fingerprint) is known.

SUMMARY

The present application generally relates to a sensor and a sensor-equipped device.

According to one embodiment, a sensor includes a panel. The panel includes a cell having a detection surface and a non-detection surface, and a support substrate formed of resin and bonded to the non-detection surface of the cell. The cell includes an insulating substrate formed of resin and having a first surface and a second surface, a first protective layer facing the second surface of the insulating substrate, and a sensor electrode disposed between the insulating substrate and the first protective layer. A thickness of the support substrate is greater than a thickness of the insulating substrate, and is greater than a thickness of the first protective layer.

BRIEF DESCRIPTION OF THE DRAWINGS

FIG. 17 is an illustration for explaining a manufacturing method of the IC card according to the third embodiment, and is a plan view for explaining a process of fixing a first wiring substrate to a panel of a sensor.

FIG. 18 is a cross-sectional view showing the first wiring substrate and a part of the panel of FIG. 17.

FIG. 23 is a plan view showing a panel of a sensor according to a modification example, and is an illustration showing a first protective layer and the like.

DETAILED DESCRIPTION

Figure 1:
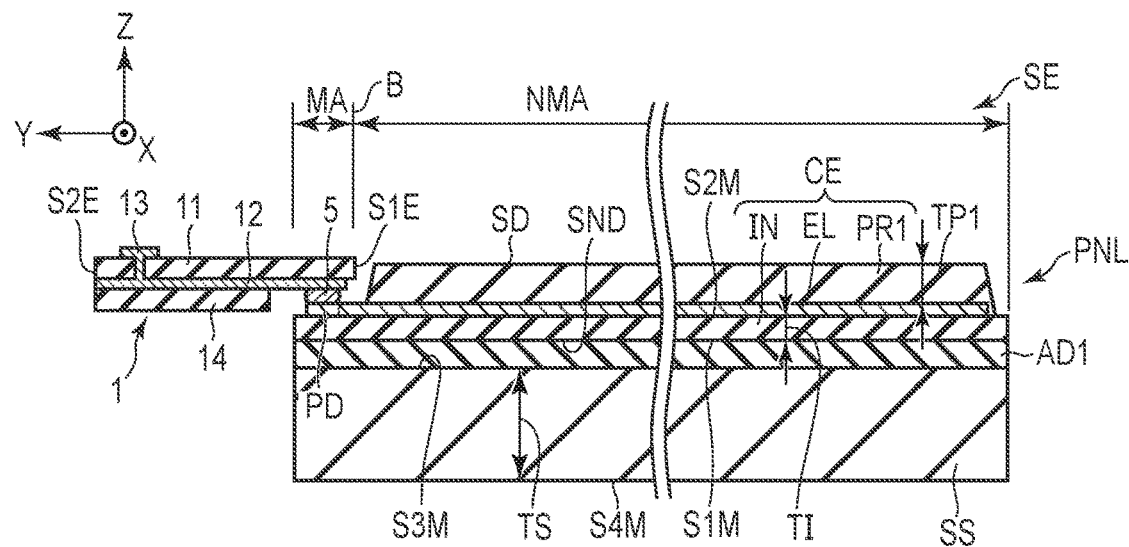
FIG. 1 is a cross-sectional view showing a sensor according to the first embodiment.

In general, according to one embodiment, there is provided a sensor comprising a panel which includes a cell having a detection surface and a non-detection surface on an opposite side to the detection surface and a support substrate formed of resin and bonded to the non-detection surface of the cell. The cell includes an insulating substrate formed of resin and having a first surface and a second surface on an opposite side to the first surface, a first protective layer arranged opposed to the second surface of the insulating substrate, and a sensor electrode disposed between the insulating substrate and the first protective layer. A thickness of the support substrate is greater than a thickness of the insulating substrate, and is greater than a thickness of the first protective layer.

According to another embodiment, there is provided a sensor-equipped device comprising: a sensor comprising a panel which includes a cell having a detection surface and a non-detection surface on an opposite side to the detection surface and a support substrate formed of resin and bonded to the non-detection surface of the cell, and a first wiring substrate which is coupled to the cell; a second wiring substrate coupled to the first wiring substrate; and a controller coupled to the second wiring substrate. The cell includes an insulating substrate formed of resin and having a first surface and a second surface on an opposite side to the first surface, a first protective layer arranged opposed to the second surface of the insulating substrate, and a sensor electrode disposed between the insulating substrate and the first protective layer. The first wiring substrate includes a core layer and a connection line arranged on the core layer, and extends from a first end surface close to the cell to a second end surface close to the second wiring substrate. A thickness of the support substrate is greater than a thickness of the insulating substrate, and is greater than a thickness of the first protective layer. The connection line is exposed at the second end surface.

Embodiments of the invention will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, and the like of the respective parts are illustrated schematically in the drawings, rather than as an accurate representation of what is implemented. However, such schematic illustration is merely exemplary, and in no way restricts the interpretation of the invention. In addition, in the specification and drawings, elements similar to those described in connection with preceding drawings are denoted by the same reference symbols, and detailed explanations of them may be appropriately omitted.

First Embodiment

First, a sensor SE according to the first embodiment will be explained. FIG. 1 is a cross-sectional view showing the sensor SE according to the first embodiment.

As shown in FIG. 1, a first direction X and a second direction Y are orthogonal to each other. A third direction Z is orthogonal to the first direction X and the second direction Y. Note that, unlike the present embodiment, the first direction X and the second direction Y may cross each other at an angle other than 90°.

In the present embodiment, a direction toward a pointing end of an arrow indicating the third direction Z will be defined as above, and a direction opposite to the direction toward the pointing end of the arrow indicating the third direction Z will be defined as below. In addition, when described as "the second member above the first member" and "the second member below the first member", the second member may be in contact with the first member or apart from the first member.

The sensor SE includes a panel PNL and a first wiring substrate 1. The panel PNL includes a cell CE, a support substrate SS, and an adhesive layer AD1. The cell CE includes a detection surface SD and a non-detection surface SND on an opposite side to the detection surface. The cell CE includes a mounting area MA, a non-mounting area NMA, and a linear boundary B between the mounting area MA and the non-mounting area NMA. For example, the boundary B extends in the first direction X. The cell CE includes an insulating substrate IN, an element layer EL and a first protective layer PR1.

The insulating substrate IN is located in the mounting area MA and the non-mounting area NMA. The insulating substrate IN is formed of an organic insulating material such as resin. The insulating substrate IN is formed of, for example, polyimide. Therefore, it may be more appropriate to refer to the insulating substrate IN as an organic insulating substrate or a resin substrate. Alternatively, it may be more appropriate to refer to the insulating substrate IN as an insulating layer, an organic insulating layer or a resin layer. The insulating substrate IN includes a first surface S1M and a second surface S2M on an opposite side to the first surface.

The element layer EL is disposed on the second surface S2M of the insulating substrate IN. The element layer EL is located in the mounting area MA and the non-mounting area NMA. The element layer EL includes a pad PD and the like located in the mounting area MA.

The first protective layer PR1 is arranged opposed to the second surface S2M of the insulating substrate IN. Therefore, the element layer EL is disposed between the insulating substrate IN and the first protective layer PR1. In the present embodiment, the first protective layer PR1 is arranged in the non-mounting area NMA but is not arranged in the mounting area MA. The first protective layer PR1 covers the element layer EL and is in contact with the element layer EL in the non-mounting area NMA. Note that the first protective layer PR1 only has to be disposed such that the pad PD is exposed. Therefore, the first protective layer PR1 may be disposed in an area of the mounting area MA where the pad PD is not located.

In the present embodiment, the detection surface SD of the cell CE is a surface of the first protective layer PR1 which is located on an opposite side to a surface opposed to the element layer EL. The non-detection surface SND of the cell CE is the first surface S1M.

The support substrate SS is formed of an organic insulating material such as resin. The support substrate SS is formed of, for example, polyethylene terephthalate (PET). Note that the support substrate SS may be formed of another resin such as polyethylene naphthalate (PEN). Note that it may be more appropriate to refer to the support substrate SS as a support layer, an insulating layer, an organic insulating layer or a resin layer.

The adhesive layer AD1 is located between the non-detection surface SND of the cell CE and the support substrate SS. The support substrate SS is bonded to the non-detection surface SND of the cell CE by the adhesive layer AD1. Note that the support substrate SS may be bonded to the non-detection surface SND of the cell CE using a pressure-sensitive adhesive layer instead of the adhesive layer AD1. The support substrate SS has a third surface S3M opposed to the cell CE and a fourth surface S4M on an opposite side to the third surface.

A thickness TS of the support substrate SS is greater than a thickness TI of the insulating substrate IN and, is greater than a thickness TP1 of the first protective layer PR1. The thickness TI should preferably be, for example, greater than or equal to 5 μm but less than or equal to 30 μm. The thickness TP1 should preferably be, for example, greater than or equal to 5 μm but less than or equal to 200 μm. The thickness TS should preferably be, for example, greater than or equal to 50 μm but less than or equal to 300 μm. Note that the numerical values of the thicknesses described in the specification are presented by way of example. Therefore, these are not intended to deny the possibility that the numerical values of the thicknesses may be outside the ranges described in the specification.

By using the support substrate SS and the first protective layer PR1, the panel PNL can be thickened, and the mechanical strength of the panel PNL to a stress such as bending can be increased. For example, the mechanical strength of the mounting area MA of the panel PNL can be increased by the support substrate SS.

The first wiring substrate 1 is coupled to the cell CE. The first wiring substrate 1 is mounted in the mounting area MA of the cell CE. The first wiring substrate 1 is electrically connected to the pad PD via an anisotropic conductive film (ACF) 5 which is a conducive material, and is physically fixed to the cell CE.

The first wiring substrate 1 includes a core layer 11, a connection line 12, a pad 13 and an insulating layer 14, and these are integrally formed. The connection line 12 is arranged on the core layer 11. The connection line 12 is opposed to the pad PD of the cell CE and is connected to the pad PD via the anisotropic conductive film 5. The pad 13 is located on an opposite side to the connection line 12 with respect to the core layer 11. The pad 13 is electrically connected to the connection line 12 through a through-hole formed in the core layer 11. The insulating layer 14 covers the connection line 12. Therefore, the connection line 12 is disposed between the core layer 11 and the insulating layer 14. Note that the insulating layer 14 exposes at least a part of the connection line 12 which is connected to the pad PD. Note that, unlike the present embodiment, the pad 13 may be located on an opposite side to the connection line 12 with respect to the insulating layer 14.

The first wiring substrate 1 has a first end surface S1E and a second end surface S2E and extends from the first end surface to the second end surface. In the present embodiment, the first wiring substrate 1 extends in the second direction Y. The first end surface S1E is opposed in the second direction Y to the first protective layer PR1 of the cell CE. The connection line 12 is exposed at the second end surface S2E. In other words, the second end surface S2E of the first wiring substrate 1 includes an end surface of the core layer 11, an end surface of the connection line 12, and an end surface of the insulating layer 14.

Note that the first wiring substrate 1 only has to include at least the core layer 11 and the connection line 12. In that case, the connection line 12 only has to include a portion connected to the pad PD and a portion substituting for the pad 13.

In the first wiring substrate 1 of the present embodiment, the core layer 11 and the insulating layer 14 are formed of resin such as polyimide. The first wiring substrate 1 is a flexible substrate as a printed circuit board.

Figure 2:
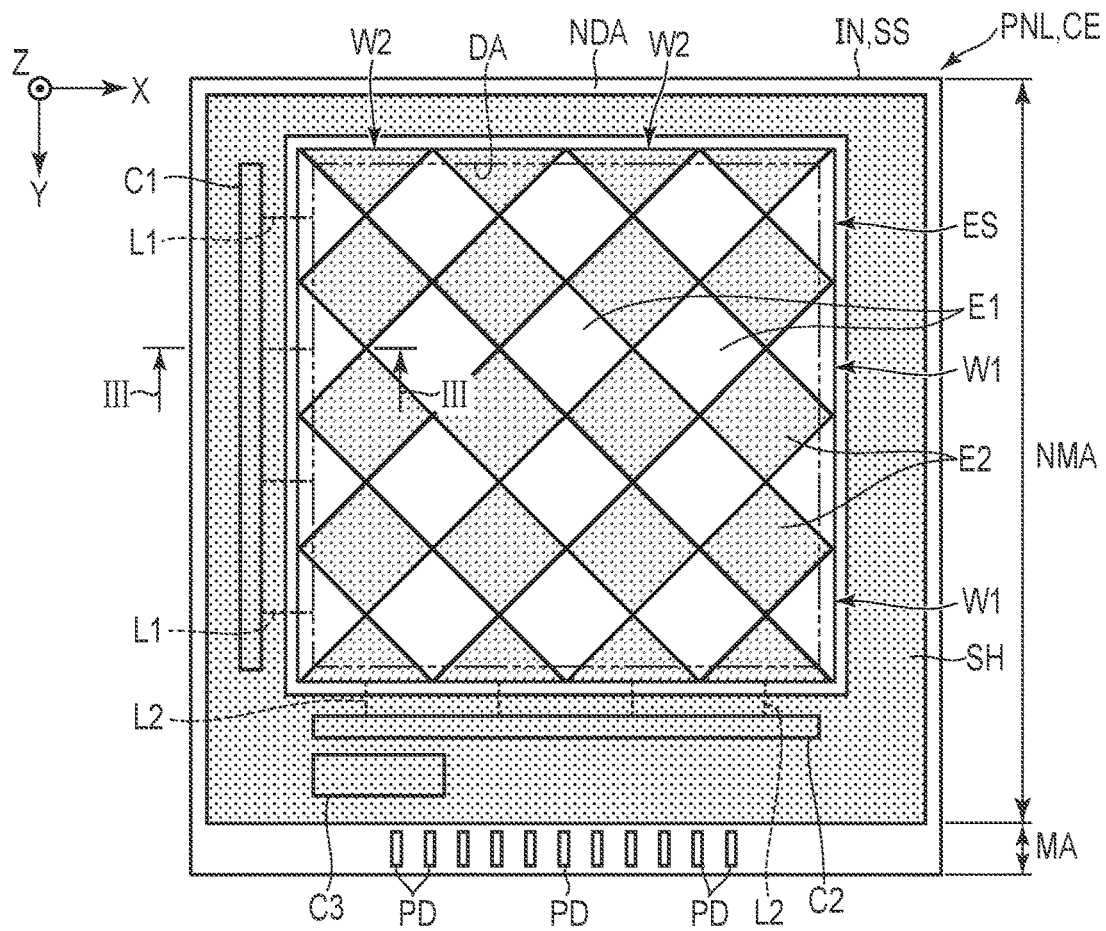
FIG. 2 is a plan view showing a panel of the sensor.

FIG. 2 is a plan view showing the panel PNL of the sensor SE.

As shown in FIG. 2, the insulating substrate IN and the support substrate SS have a quadrangular shape. The non-mounting area NMA of the cell CE includes a detection area DA and a non-detection area NDA outside the detection area. The element layer EL includes a plurality of pads PD, a sensor electrode ES, a first circuit C1, a second circuit C2, a third circuit C3, a plurality of wiring lines L1 and L2, and a shield electrode SH.

The pads PD are arranged at intervals in the first direction X in the mounting area MA. The sensor electrode ES is located at least in the detection area DA, and includes a plurality of first electrodes E1 and a plurality of second electrodes E2. Each first wiring line W1 includes the first electrodes E1 arranged in the first direction X. Each second wiring line W2 includes the second electrodes E2 arranged in the second direction Y. The first circuit C1, the second circuit C2, the third circuit C3 and the shield electrode SH are located in the non-detection area NDA. In the planar view of FIG. 2, the shield electrode SH covers the first circuit C1, the second circuit C2 and the third circuit C3. In the drawing, a pattern of dots is added to the second electrode E2 and the shield electrode SH.

Each wiring line L1 connects the first electrode E1 at an end close to the first circuit C1 of the first electrodes E1 and the first circuit C1. Each wiring line L2 connects the second electrode E2 at an end close to the second circuit C2 of the second electrodes E2 and the second circuit C2. Note that the first circuit C1, the second circuit C2 and the third circuit C3 are connected to the pads PD via wiring lines which are not shown in the drawing. The third circuit C3 includes a timing generator, various logic circuits, and the like.

The cell CE carries out sensing for detecting contact or approach of an object with or to the detection surface SD. The object is not particularly limited but is, for example, a fingerprint (a pattern of ridges on a surface of a finger). A sensing method of the cell CE of the present embodiment is mutual capacitance method. The cell CE can detect contact or approach of an object based on a change in electrostatic capacitance between the first wiring line W1 and the second wiring line W2.

For example, the first wiring line W1 functions as a sensor drive electrode, and the second wiring line W2 functions as a detection electrode. The first circuit C1 functions as a drive circuit and supplies a sensor drive signal to the first wiring line W1 via the wiring line L1. In accordance with the supply of the sensor drive signal to the first wiring line W1, the second wiring line W2 outputs a sensor signal required for sensing, that is, a signal based on a change in capacitance between the first wiring line W1 and the second wiring line W2. The second circuit C2 functions as, for example, a control circuit such as a multiplexer.

Figure 3:
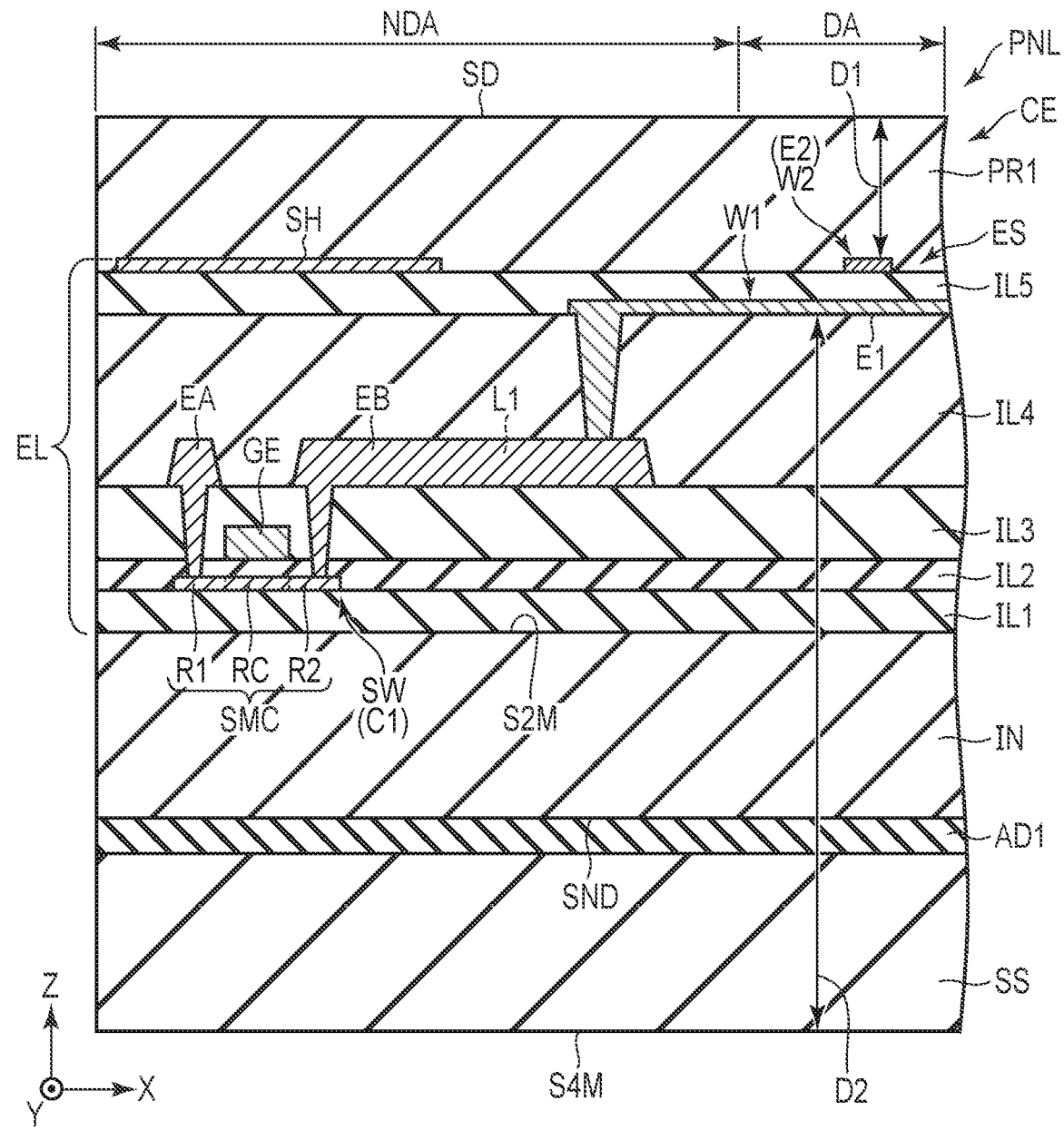
FIG. 3 is a cross-sectional view showing the panel along line III-III of FIG. 2.

FIG. 3 is a cross-sectional view showing the panel PNL along line III-III of FIG. 2. Here, in particular, the element layer EL of the panel PNL will be explained.

As shown in FIG. 3, an insulating layer IL1 is disposed on the second surface S2M of the insulating substrate IN. A semiconductor layer SMC is arranged on the insulating layer IL1. The semiconductor layer SMC includes a first area R1, a second area R2, and a channel area RC between the first area R1 and the second area R2. One of the first area R1 and the second area R2 functions as a source area, and the other functions as a drain area. In the present embodiment, the semiconductor layer SMC is formed using low temperature polycrystalline silicon. Note that the semiconductor layer SMC may be formed of semiconductor other than polycrystalline silicon such as amorphous silicon or oxide semiconductor.

An insulating layer IL2 is disposed on the insulating layer IL1 and the semiconductor layer SMC. A gate electrode GE is arranged on the insulating layer IL2. The gate electrode GE is opposed to at least the channel area RC of the semiconductor layer SMC. The gate electrode GE is formed using, for example, molybdenum tungsten (MoW) as a metal material.

An insulating layer IL3 is disposed on the insulating layer IL2 and the gate electrode GE. An electrode EA and an electrode EB are arranged on the insulating layer IL3. The electrode EA is in contact with the first area R1 through a contact hole formed in the insulating layer IL2 and the insulating layer IL3. On the other hand, the electrode EB is in contact with the second area R2 through another contact hole formed in the insulating layer IL2 and the insulating layer IL3. A part of the electrode EB functions as the wiring line L1 shown in FIG. 2.

The electrode EA and the electrode EB are formed of a metal material. For example, the electrode EA and the electrode EB each adopt a triple-layer stack structure (Ti-based/Al-based/Ti-based) and each include a lower layer formed of a metal material composed mostly of titanium (Ti) such as Ti or alloy containing Ti, a middle layer formed of a metal material composed mostly of aluminum (Al) such as Al or alloy containing Al, and an upper layer formed of a metal material composed mostly of Ti such as Ti or alloy containing Ti.

Note that the semiconductor layer SMC, the gate electrode GE, the electrode EA, the electrode EB and the like constitute a switching element SW. The switching element SW is formed of a thin-film transistor (TFT) and is included in the first circuit C1 shown in FIG. 2.

An insulating layer IL4 is disposed on the insulating layer IL3, the electrode EA and the electrode EB. The first wiring line W1 such as the first electrode E1 is arranged on the insulating layer IL4. The first wiring line W1 is in contact with the electrode EB through a contact hole formed in the insulating layer IL4. Therefore, the first wiring line W1 is electrically connected to the switching element SW (first circuit C1).

An insulating layer IL5 is disposed on the insulating layer IL4 and the first wiring line W1. The second wiring line W2 including the second electrode E2 and the shield electrode SH are arranged on the insulating layer IL5. Although not shown in the drawing, the second wiring line W2 is electrically connected to a switching element (for example, TFT) of the second circuit C2 shown in FIG. 2. The wiring line L2 is formed, for example, in a layer at the same level as the wiring line L1.

The first wiring line W1, the second wiring line W2 and the shield electrode SH are formed of a transparent conductive material such as indium tin oxide (ITO) or indium zinc oxide (IZO). In the present embodiment, the first wiring line W1, the second wiring line W2 and the shield electrode SH are formed of ITO.

Note that, in the present embodiment, the pad PD shown in FIG. 2 adopts a triple-layer stack structure and includes a lower layer formed of the same material as the electrode EA and the electrode EB, a middle layer formed of the same material as the first wiring line W1, and an upper layer formed of the same material as the second wiring line W2. Note that the structure of the pad PD is not limited to the structure of the present embodiment but can be variously modified.

Each of the insulating layers IL1 to IL5 is an inorganic insulating layer or an organic insulating layer. In the present embodiment, the insulating layers IL1, IL2, IL3 and IL5 are inorganic insulating layers, and the insulating layer IL4 is an organic insulating layer.

From the above, the element layer EL has a multilayer stack structure from the insulating layer IL1 to the second wiring line W2 and the shield electrode SH. In the cell CE, the insulating substrate IN is located closer to the non-detection surface SND than the sensor electrode ES, and the first protective layer PR1 is located closer to the detection surface SD than the sensor electrode ES.

The first protective layer PR1 is disposed on the insulating layer IL5, the second wiring line W2 and the shield electrode SH. Therefore, the shield electrode SH is located between the insulating substrate IN and the first protective layer PR1. The switching element SW (first circuit C1) is located between the insulating substrate IN and the shield electrode SH, and is electrically shielded by the shield electrode SH. Note that the same applies to the second circuit C2 and the third circuit C3 shown in FIG. 2, and the second circuit C2 and the third circuit C3 are electrically shielded by the shield electrode SH.

In addition, the shield electrode SH can suppress leakage of an electric field from the switching element SW (first circuit C1) and the second circuit C2 to the sensor electrode ES. In other words, the shield electrode SH can effectively block noise generated from the switching element SW (first circuit C1) and the second circuit C2. The insulating layer IL4 which is an organic insulating layer is interposed between the shield electrode SH and the electrodes EA and EB. The shield electrode SH can be arranged at a distance from the switching element SW. Therefore, the shield effect by the shield electrode SH can be obtained while the load of capacitance which may be coupled to the switching element SW is suppressed by the shield electrode SH. Note that the thickness of the insulating layer IL4 should preferably be, for example, greater than or equal to 1 μm but less than or equal to 5 μm.

Here, the distance from the sensor electrode ES to the detection surface SD will be defined as a first distance D1. The distance from the sensor electrode ES to the fourth surface S4M will be defined as a second distance D2. In the present embodiment, the first distance D1 is the distance from the second wiring line W2 to the detection surface SD, and the second distance D2 is the distance from the first wiring line W1 to the fourth surface S4M. The first distance D1 is less than the second distance D2. Since the second distance D2 is made larger than the distance from the sensor electrode ES to an object, the impact of a capacitance change other than a capacitance change related to the object can be suppressed.

In the present embodiment, it is not necessary to arrange a switching element such as the switching element SW in the detection area DA. The first wiring line W1 and the second wiring line W2 can be formed of ITO. As compared with a case where the switching element is arranged in the detection area DA or a case where the first wiring line W1 and the second wiring line W2 are formed of metal, the light transmittance of the detection area DA can be increased. Accordingly, the sensor SE can be formed on various devices such as a display device.

Figure 4:
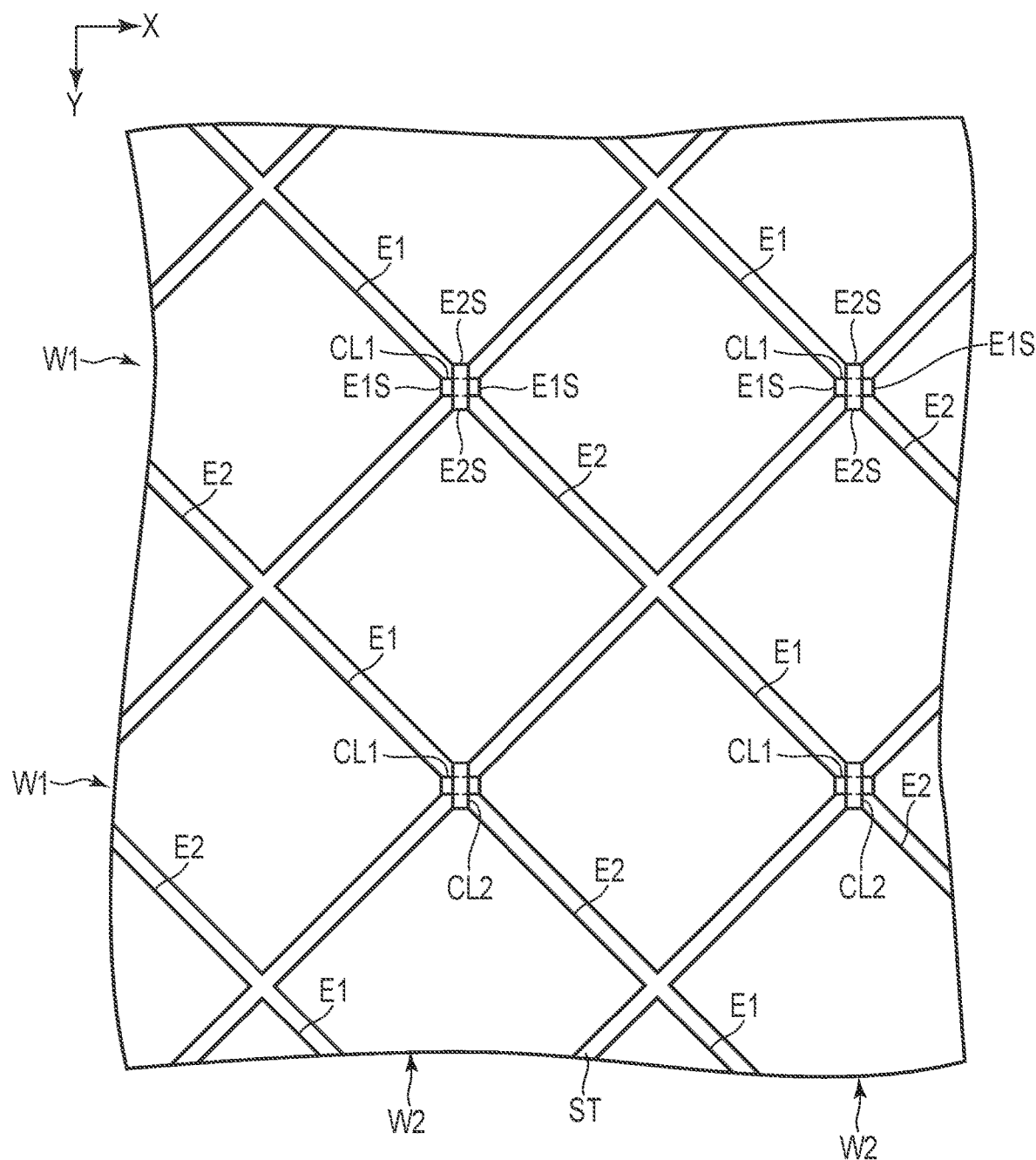
FIG. 4 is an enlarged plan view showing a part of the panel.

FIG. 4 is an enlarged plan view showing a part of the panel PNL.

As shown in FIG. 4 as well as FIGS. 2 and 3, the first wiring line W1 includes not only the first electrodes E1 but also a plurality of connection lines CL1. The second wiring line W2 includes not only the second electrodes E2 but also a plurality of connection lines CL2.

The first electrodes E1 are arranged in the first direction X and the second direction Y. The first electrode E1 has a square shape having diagonal lines extending along the first direction X and the second direction Y, respectively. The first electrode E1 has first corner portions opposed to each other along the first direction X. In the present embodiment, the first corner portions of the first electrode E1 with the square shape are crushed and have first short sides E1S. Therefore, the first electrode E1 has a hexagonal shape having the first short sides E1S. In the first direction X, the connection line CL1 connects the first corner portions which are adjacent to each other (first short sides E1S which are adjacent to each other).

The connection line CL1 is interposed between the insulating layer IL4 and the insulating layer IL5, is formed of the same material as the material of the first electrode E1, and is integrally formed with the first electrode E1. The first electrodes E1 and the connection lines CL1 which are connected together form the first wiring line W1 which extends in the first direction X. The first wiring lines W1 are arranged in the second direction Y.

In planar view, the second electrodes E2 are arranged in the first direction X and the second direction Y while being spaced apart from the first electrodes E1. The second electrode E2 has a square shape having diagonal lines extending along the first direction X and the second direction Y, respectively. The second electrode E2 has second corner portions opposed to each other along the second direction Y. In the present embodiment, the second corner portions of the second electrode E2 with the square shape are crushed and have second short sides E2S. Therefore, the second electrode E2 has a hexagonal shape having the second short sides E2S. In the second direction Y, the connection line CL2 connects the second corner portions which are adjacent to each other (second short sides E2S which are adjacent to each other).

The connection line CL2 is interposed between the insulating layer IL5 and the first protective layer PR1, is formed of the same material as the material of the second electrode E2, and is integrally formed with the second electrode E2. In planar view, the connection line CL2 crosses the connection line CL1. The insulating layer IL5 is interposed between the connection line CL1 and the connection line CL2. The second electrodes E2 and the connection lines CL2 which are connected together form the second wiring line W2 which extends in the second direction Y. The second wiring lines W2 are arranged in the first direction X.

In planar view, slits ST are formed in a grid pattern between the first electrodes E1 and the second electrodes E2.

The sensor SE is configured as described above.

Next, a manufacturing method of the sensor SE will be explained.

Figure 5:
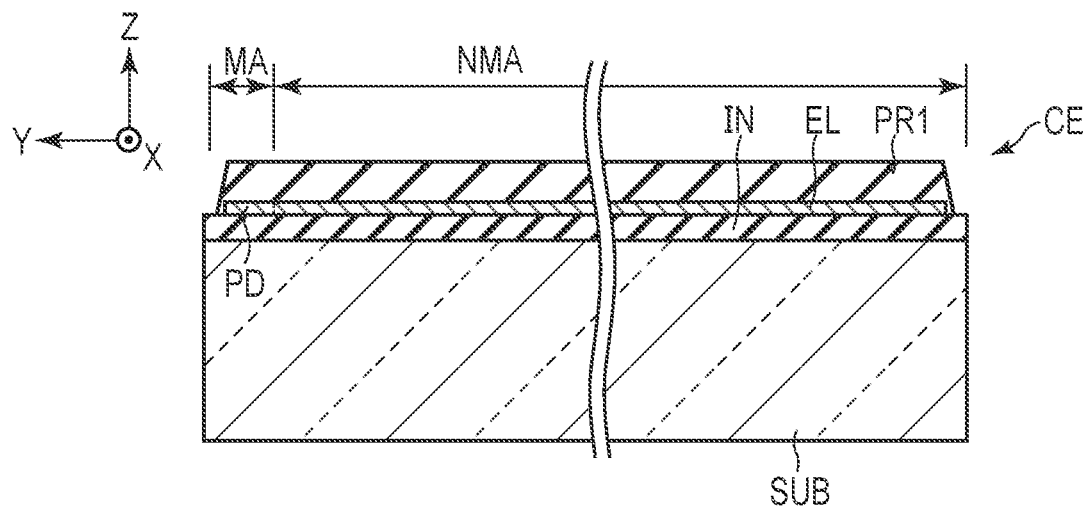
FIG. 5 is an illustration for explaining a manufacturing method of the sensor according to the first embodiment, and is a cross-sectional view for explaining a process of forming a cell (an insulating substrate, an element layer and a first protective layer) on a substrate.

As shown in FIG. 5, when the manufacturing of the sensor SE is started, a substrate SUB is prepared first. In the present embodiment, a glass substrate is used as the substrate SUB. Then, polyimide having high heat resistance is applied on the substrate SUB. Accordingly, the insulating substrate IN is formed on the substrate SUB. Next, the element layer EL is formed on the insulating substrate IN by repeating film forming and patterning. Therefore, the switching element SW and the like can be formed on the insulating substrate IN having high heat resistance. After that, the first protective layer PR1 is formed on the insulating substrate IN and the element layer EL. Accordingly, the cell CE is formed on the substrate SUB.

Figure 6:
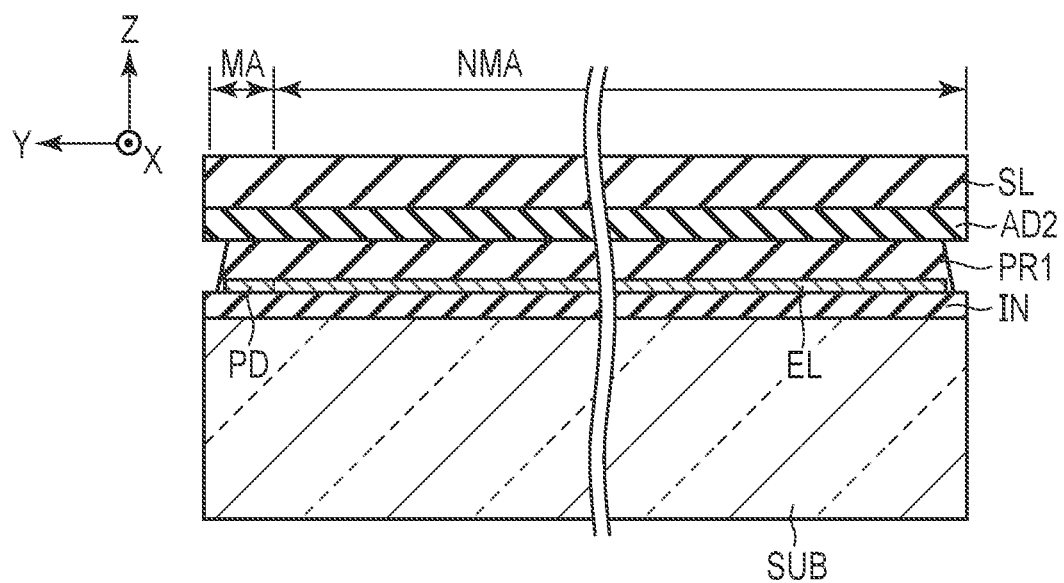
FIG. 6 is an illustration for explaining the manufacturing method following FIG. 5, and is a cross-sectional view for explaining a process of bonding a support layer to the cell.

Then, as shown in FIG. 6, the support layer SL is bonded to the first protective layer PR1 via an adhesive layer AD2. After that, laser light is emitted to the insulating substrate IN from a substrate SUB side using a laser. When the laser light reaches the insulating substrate IN, ablation which absorbs and decomposes the laser light occurs at the interface between the insulating substrate IN and the substrate SUB.

Figure 7:
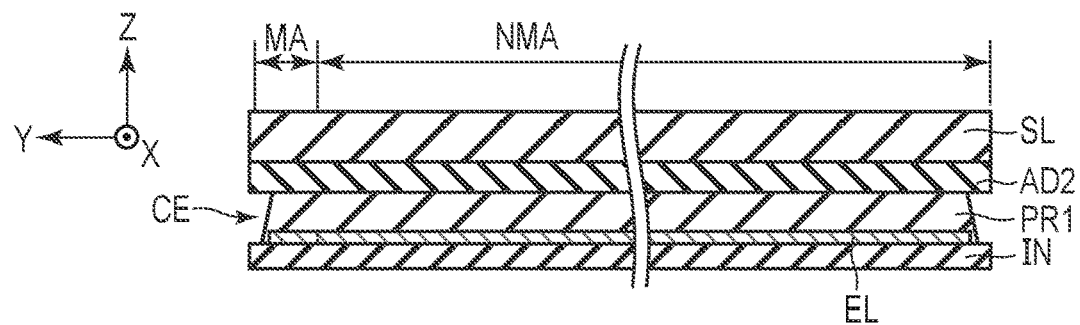
FIG. 7 is an illustration for explaining the manufacturing method following FIG. 6, and is a cross-sectional view for explaining a state where the substrate is peeled off the cell.

Accordingly, as shown in FIG. 7, a space is generated at the interface between the substrate SUB and the insulating substrate IN, and the substrate SUB is peeled off the insulating substrate IN.

Figure 8:
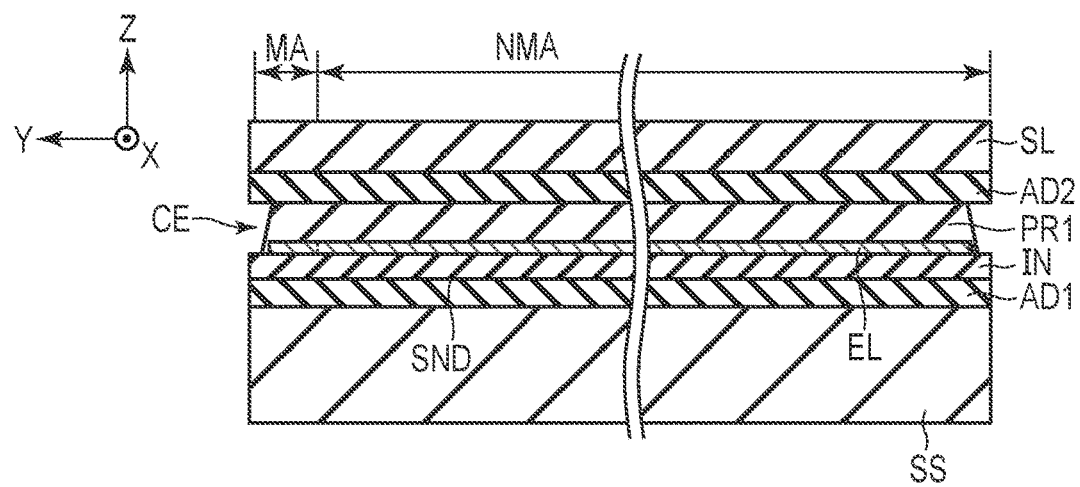
FIG. 8 is an illustration for explaining the manufacturing method following FIG. 7, and is a cross-sectional view for explaining a process of bonding a support substrate to the cell.

After that, as shown in FIG. 8, the support substrate SS is bonded to the insulating substrate IN via the adhesive layer AD1. Accordingly, the flexible and thick support substrate SS can be disposed on the non-detection surface SND of the cell CE. Note that, since such high heat resistance as that of the insulating substrate IN is not required for the support substrate SS, the support substrate SS can be formed using PET or the like. Then, the support layer SL and the adhesive layer AD2 are removed from the first protective layer PR1. Here, since the support layer SL is an indirect material and is discarded in the manufacturing process, the support layer SL is not used as a part of a final product.

Figure 9:
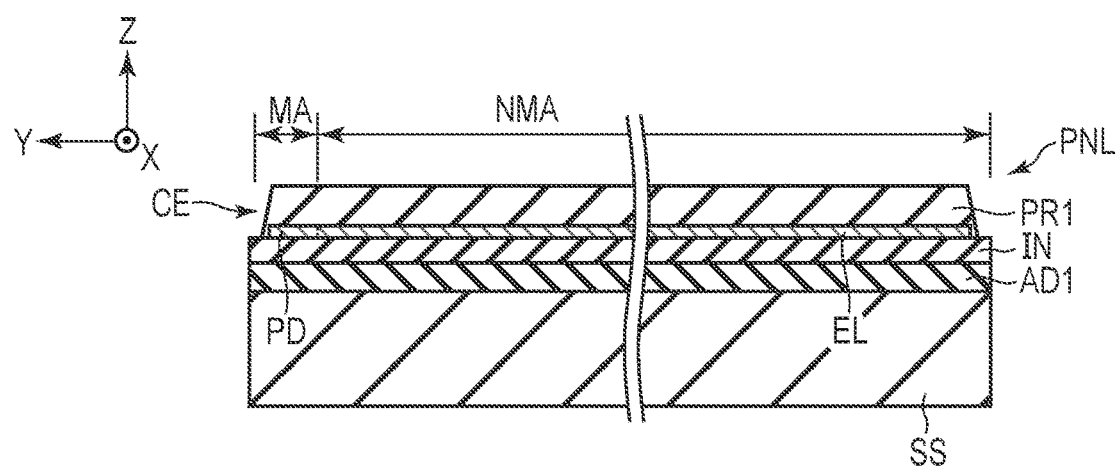
FIG. 9 is an illustration for explaining the manufacturing method following FIG. 8, and is a cross-sectional view for explaining a process of peeling the support layer off the cell.

As shown in FIG. 9, the panel PNL is thereby formed. Then, the pad PD is exposed by removing a part of the first protective layer PR1 which is located in the mounting area MA.

After that, as shown in FIG. 1, the first wiring substrate 1 is mounted in the mounting area MA of the cell CE. Accordingly, the manufacturing of the sensor SE ends.

Note that the timing for mounting the first wiring substrate 1 in the mounting area MA of the cell CE is not limited to the above example. For example, in FIG. 5, after the cell CE is formed on the substrate SUB, the pad PD may be exposed by removing a part of the first protective layer PR1 which is located in the mounting area MA. Then, after the first wiring substrate 1 is mounted in the mounting area MA of the cell CE, the support layer SL may be bonded to the first protective layer PR1 via the adhesive layer AD2. At this time, the support layer SL may be bonded also to the first wiring substrate 1 via the adhesive layer AD2.

According to the first embodiment configured as described above, the sensor SE includes the support substrate SS and the first protective layer PR1 in addition to the cell CE. Therefore, the sensor SE which can increase mechanical strength can be obtained.

The thickness TS of the support substrate SS is greater than the thickness TI of the insulating substrate IN, and is greater than the thickness TP1 of the first protective layer PR1. In addition, the first distance D1 is less than the second distance D2. The impact of a capacitance change other than a capacitance change related to an object can be suppressed. Therefore, the sensor SE which has excellent detection accuracy can be obtained.

Second Embodiment

Figure 10:
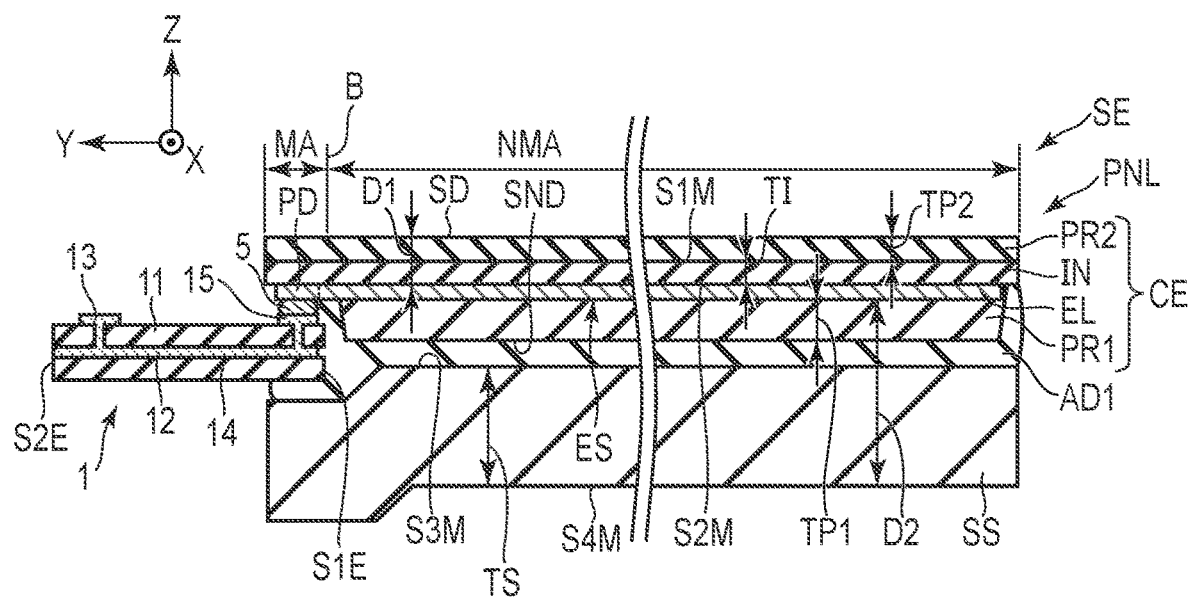
FIG. 10 is a cross-sectional view showing a sensor according to the second embodiment.

Next, the sensor SE according to the second embodiment will be explained. The sensor SE according to the second embodiment is configured similarly to the first embodiment except for points which will be described later. FIG. 10 is a cross-sectional view showing the sensor SE according to the second embodiment.

As shown in FIG. 10, the cell CE further includes a second protective layer PR2 located closer to the detection surface SD than the insulating substrate IN. In the cell CE, the first protective layer PR1 is located closer to the non-detection surface SND than the sensor electrode ES (element layer EL), and the insulating substrate IN is located closer to the detection surface SD than the sensor electrode ES. In the present embodiment, the second protective layer PR2 has the detection surface SD, and the first protective layer PR1 has the non-detection surface SND.

The first wiring substrate 1 includes the core layer 11, the connection line 12, the pad 13, the insulating layer 14 and a pad 15, and these are integrally formed. The connection line 12 is arranged in the core layer 11. The pad 13 is located on an opposite side to the connection line 12 with respect to the core layer 11. The pad 13 is electrically connected to the connection line 12 through a through-hole formed in the core layer 11. The insulating layer 14 covers the connection line 12. Therefore, the connection line 12 is disposed between the core layer 11 and the insulating layer 14.

The pad 15 is located on an opposite side to the connection line 12 with respect to the core layer 11. The pad 15 is electrically connected to the connection line 12 through a through-hole formed in the core layer 11. The pad 15 is opposed to the pad PD of the cell CE and is connected to the pad PD via the anisotropic conductive film 5. Note that, unlike the present embodiment, the pad 13 may be located on an opposite side to the connection line 12 with respect to the insulating layer 14.

The first wiring substrate 1 has the first end surface S1E and the second end surface S2E and extends from the first end surface to the second end surface. In the present embodiment, the first wiring substrate 1 extends in the second direction Y. The first end surface S1E is opposed to the first protective layer PR1 of the cell CE in the second direction Y. The connection line 12 is exposed at the second end surface S2E. In other words, the second end surface S2E of the first wiring substrate 1 includes an end surface of the core layer 11, an end surface of the connection line 12, and an end surface of the insulating layer 14.

Note that the first wiring substrate 1 only has to include at least the core layer 11, the connection line 12, the pad 13 and the pad 15.

The support substrate SS and the mounting area MA of the cell CE sandwich the first wiring substrate 1 and physically fix the first wiring substrate 1. The adhesive layer AD1 is also interposed between the support substrate SS and the first wiring substrate 1, and is in contact with the first end surface S1E and the like of the first wiring substrate 1. Accordingly, as compared with a case where the support substrate SS and the mounting area MA of the cell CE do not sandwich the first wiring substrate 1, the mechanical strength of a part of the first wiring substrate 1 which is mounted in the mounting area MA of the cell CE can be increased.

The thickness TS of the support substrate SS is greater than any of the thickness TI of the insulating substrate IN, the thickness TP1 of the first protective layer PR1, and a thickness TP2 of the second protective layer PR2. The thickness TI should preferably be, for example, greater than or equal to 5 µm but less than or equal to 30 µm. The thickness TP1 should preferably be, for example, greater than or equal to 5 µm but less than or equal to 200 µm. The thickness TP2 should preferably be, for example, greater than or equal to 10 µm but less than or equal to 20 µm. The thickness TS should preferably be, for example, greater than or equal to 50 µm but less than or equal to 300 µm.

By using the support substrate SS, the first protective layer PR1 and the second protective layer PR2, the panel PNL can be thickened, and the mechanical strength of the panel PNL to a stress such as bending can be increased. For example, the mechanical strength of the mounting area MA of the panel PNL can be increased by the support substrate SS.

Here, the distance from the sensor electrode ES (element layer EL) to the detection surface SD will be defined as the first distance D1. The distance from the sensor electrode ES (element layer EL) to the fourth surface S4M will be defined as the second distance D2. Also in the present embodiment, the first distance D1 is less than the second distance D2, and the impact of a capacitance change other than a capacitance change related to an object can be suppressed.

The second protective layer PR2 is formed on an insulating substrate IN side of the cell CE which has high mechanical strength, and the second protective layer PR2 has the detection surface SD. Accordingly, the mechanical strength of the detection surface SD can be increased.

A mounting surface of the panel PNL on which the first wiring substrate 1 is mounted is located on an opposite side to the detection surface SD. Therefore, it is possible to avoid a situation where the first wiring substrate 1 projects toward the detection surface SD. In addition, as compared with the sensor SE according to the first embodiment, the thickness of the sensor SE can be reduced.

The sensor SE is configured as described above.

Next, a manufacturing method of the sensor SE will be explained.

Figure 11:
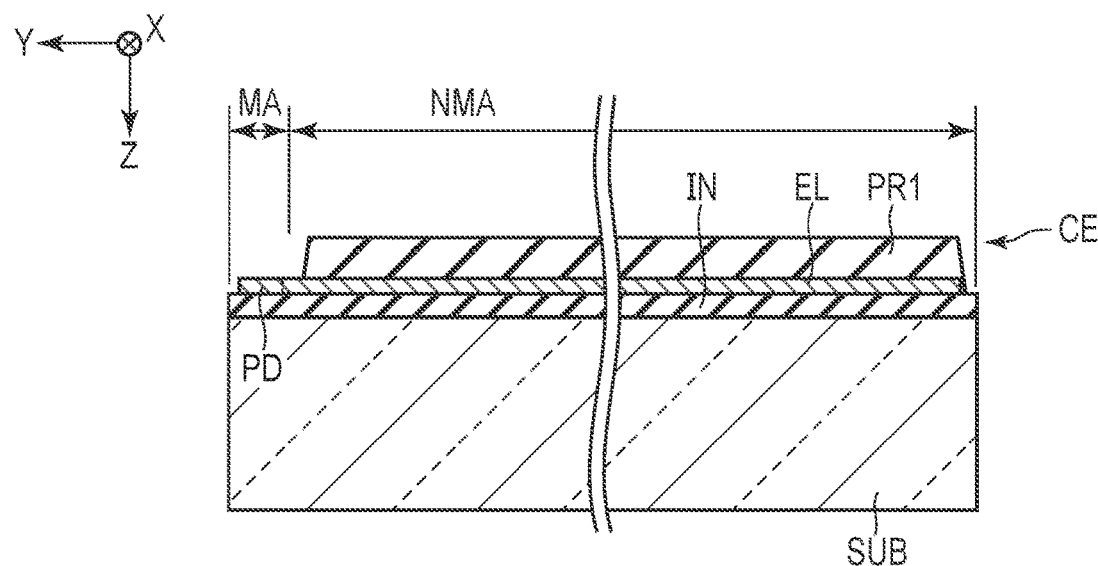
FIG. 11 is an illustration for explaining a manufacturing method of the sensor according to the second embodiment, and is a cross-sectional view for explaining a process of forming a cell (an insulating substrate, an element layer and a first protective layer) on a substrate.

As shown in FIG. 11, when the manufacturing of the sensor SE is started, the substrate SUB is prepared first. In the present embodiment, a glass substrate is used as the substrate SUB. Then, the insulating substrate IN is formed on the substrate SUB by applying polyimide having high resistance on the substrate SUB. Then, the element layer EL is formed on the insulating substrate IN by repeating film forming and patterning. After that, the first protective layer PR1 is formed on the insulating substrate IN and the element layer EL. At this time, the pad PD is exposed by removing a part of the first protective layer PR1 which is located in the mounting area MA. Accordingly, the cell CE is formed on the substrate SUB.

Figure 12:
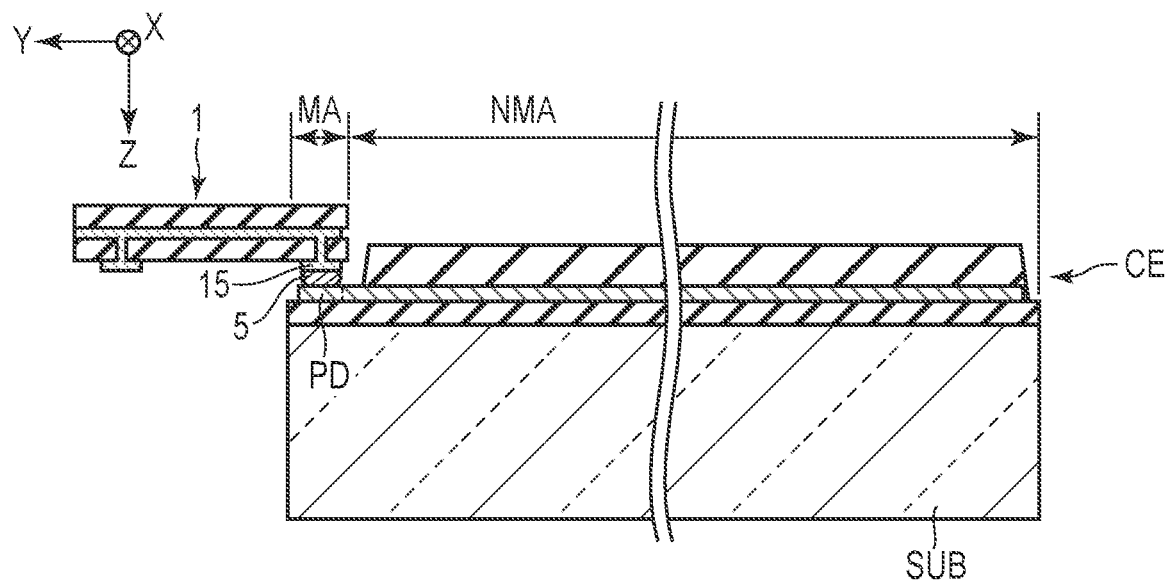
FIG. 12 is an illustration for explaining the manufacturing method following FIG. 11, and is a cross-sectional view for explaining a process of pressing/bonding a first wiring substrate to the cell.

Then, as shown in FIG. 12, the first wiring substrate 1 is mounted in the mounting area MA of the cell CE.

Figure 13:
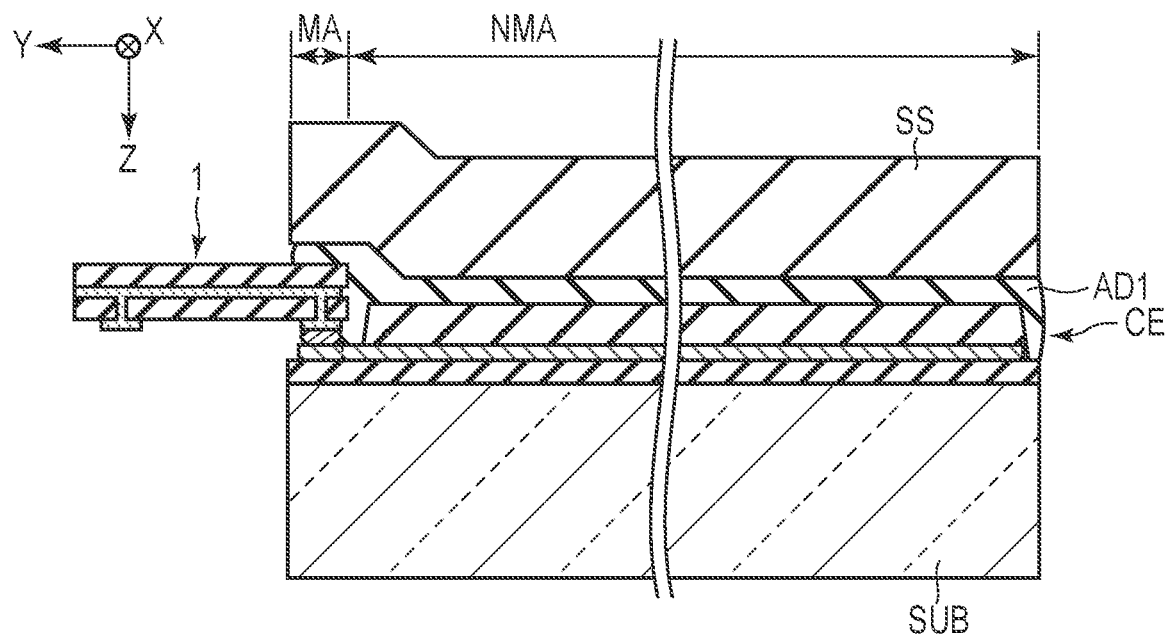
FIG. 13 is an illustration for explaining the manufacturing method following FIG. 12, and is a cross-sectional view for explaining a process of bonding a support substrate to the cell and the first wiring substrate.

Then, as shown in FIG. 13, the support substrate SS is bonded to the first protective layer PR1 and the first wiring substrate 1 via the adhesive layer AD1. Accordingly, the first wiring substrate 1 can be sandwiched between the support substrate SS and the mounting area AM of the cell CE.

After that, laser light is emitted to the insulating substrate IN from the substrate SUB side using the laser.

Figure 14:
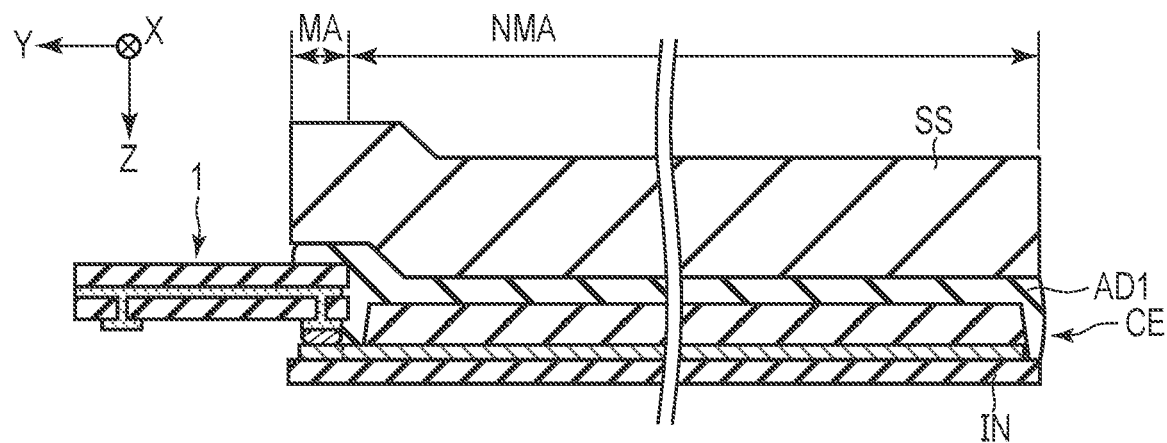
FIG. 14 is an illustration for explaining the manufacturing method following FIG. 13, and is a cross-sectional view for explaining a state where the substrate is peeled off the cell.

Accordingly, as shown in FIG. 14, the substrate SUB is peeled off the insulating substrate IN.

After that, as shown in FIG. 10, the sensor SE in process is inverted so that the insulating substrate IN is located more upward than the support substrate SS, and the second protective layer PR2 is formed on the insulating substrate IN. Accordingly, the manufacturing of the sensor SE ends.

Also in the second embodiment configured as described above, effects similar to those of the first embodiment can be obtained. In the second embodiment, since the support substrate SS and the mounting area MA of the cell CE sandwich the first wiring substrate 1, the mechanical strength of the sensor SE can be increased. In addition, the thinning of the sensor SE can be achieved.

Third Embodiment

Figure 15:
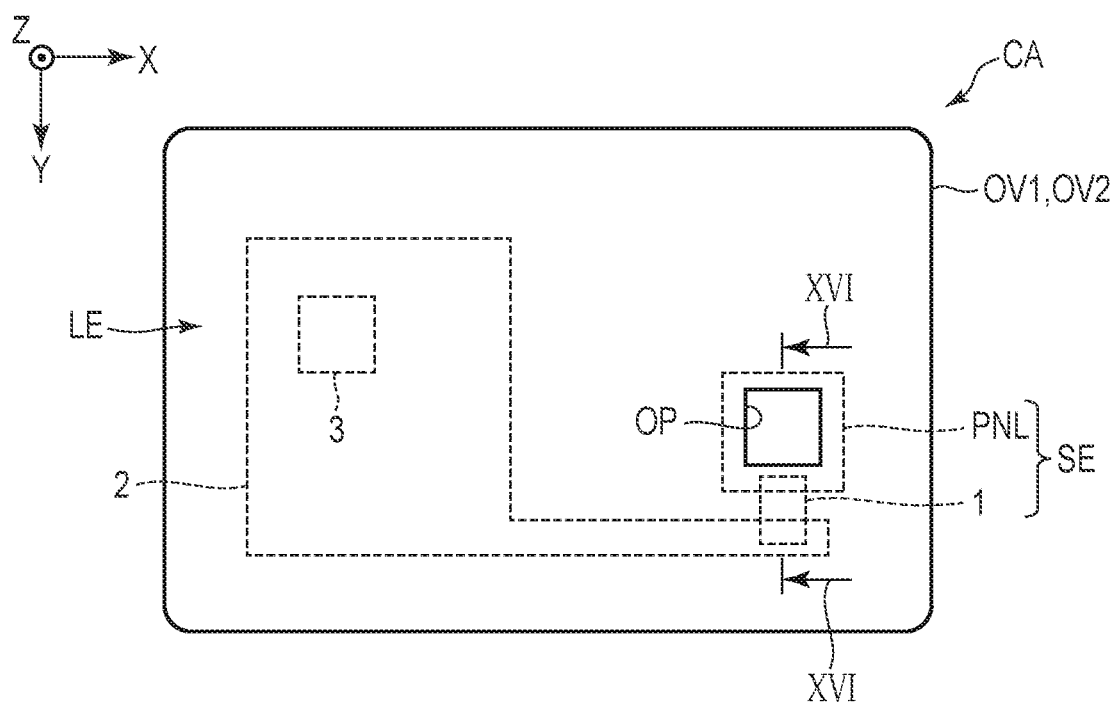
FIG. 15 is a plan view showing an IC card according to the third embodiment.

Next, a sensor-equipped device according to the third embodiment will be explained. Here, an IC card CA will be explained as an example of the sensor-equipped device. Note that, unlike the present embodiment, the sensor-equipped device can be applied to a device other than an IC card. FIG. 15 is a plan view showing the IC card CA according to the third embodiment.

As shown in FIG. 15, the IC card CA includes an inlet LE and two overlay sheets OV1 and OV2. The inlet LE includes the sensor SE including the panel PNL and the first wiring substrate 1, a second wiring substrate 2, and a controller 3. The first wiring substrate 1 is provided independently from the second wiring substrate 2. The second wiring substrate 2 is coupled to the first wiring substrate 1. The control portion 3 is coupled to the second wiring substrate 2. In the present embodiment, the controller 3 is mounted on the second wiring substrate 2. The control portion 3 is, for example, a central processing unit (CPU). The overlay sheets OV1 and OV2 cover both surfaces of the inlet LE and seal the inlet LE.

Figure 16:
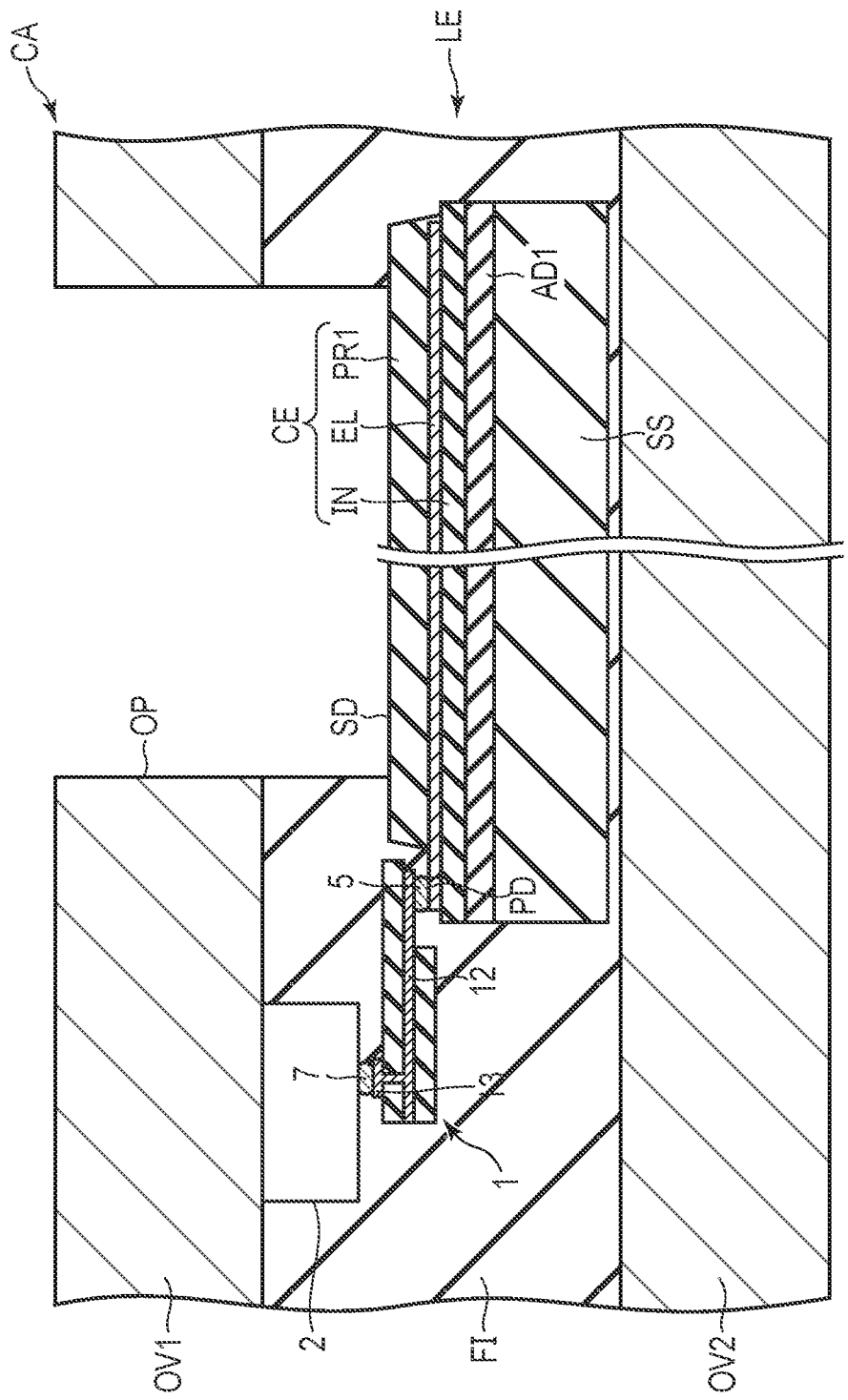
FIG. 16 is a cross-sectional view showing the IC card along line XVI-XVI of FIG. 15.

FIG. 16 is a cross-sectional view showing the IC card CA along line XVI-XVI of FIG. 15.

As shown in FIGS. 16 and 15, the inlet LE further includes a filling material FI. The inlet LE and the overlay sheets OV1 and OV2 are welded together by, for example, hot pressing or the like. The sensor SE uses the sensor of the first embodiment.

The overlay sheet OV1 opposed to the detection surface SD has an opening OP. The opening OP exposes at least the detection area DA of the detection surface SD. Note that, in an area opposed to the opening OP, the filling material FI is not present above the detection surface SD. Therefore, an object can contact or approach the detection surface SD. The pad 13 of the first wiring substrate 1 is electrically connected to the second wiring substrate 2 via an anisotropic conductive film 7 which is a conductive material, and the first wiring substrate 1 is physically fixed to the second wiring substrate 2.

The IC card CA is configured as described above.

Next, a manufacturing method of the IC card CA will be explained. In particular, a testing method of the sensor SE will be explained.

As shown in FIGS. 17 and 18, when the manufacturing of the IC card CA is started, first, the panel PNL and the first wiring substrate 1 are prepared, and the first wiring substrate 1 is mounted on the panel PNL. At this time, the first wiring substrate 1 extends further in the second direction Y than the first wiring substrate 1 of the final product shown in FIG. 15. The first wiring substrate 1 extends in the second direction Y beyond an expected dividing line DL.

On an opposite side to the first end surface S1E of the first wiring substrate 1, the insulating layer 14 partly exposes the connection line 12. By extending the first wiring substrate 1 and partly exposing the connection line 12 as described above, the first wiring substrate 1 (exposed portion of the connection line 12) can be connected to a connector of a testing board which is not shown in the drawing. Accordingly, the sensor SE of the panel PNL or the like can be tested before the first wiring substrate 1 is coupled to the second wiring substrate 2.

If the operation of the sensor SE is abnormal, the sensor SE is discarded.

If the operation of the sensor SE is normal, the first wiring substrate 1 is cut along the expected dividing line DL.

Figure 19:
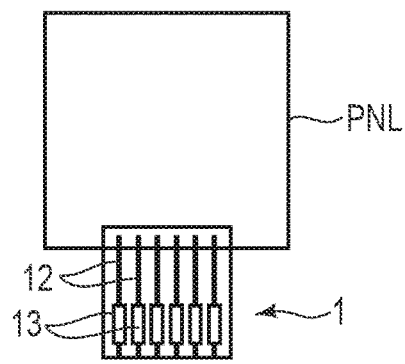
FIG. 19 is an illustration for explaining the manufacturing method following FIGS. 17 and 18, and is a plan view for explaining a process of cutting the first wiring substrate.
Figure 20:
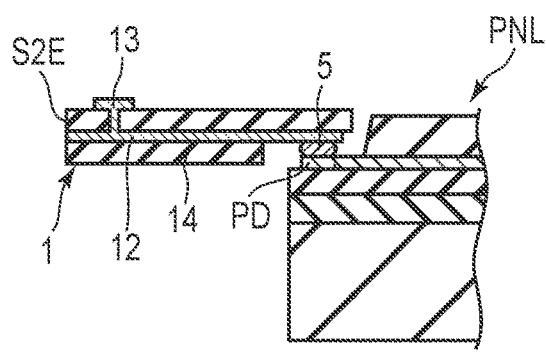
FIG. 20 is a cross-sectional view showing the first wiring substrate and a part of the panel of FIG. 19.

Accordingly, as shown in FIGS. 19 and 20, the small-sized first wiring substrate 1 can be obtained. In addition, by cutting the first wiring substrate 1 along the expected dividing line DL, the connection line 12 is exposed at the second end surface S2E of the first wiring substrate 1.

Figure 21:
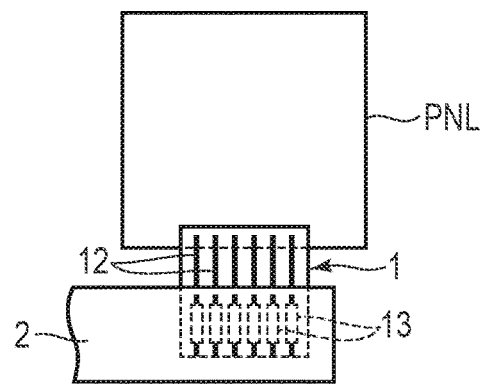
FIG. 21 is an illustration for explaining the manufacturing method following FIGS. 19 and 20, and is a plan view for explaining a process of pressing/bonding the first wiring substrate to a second wiring substrate.

After that, as shown in FIGS. 21 and 16, the first wiring substrate 1 is coupled to the second wiring substrate 2. As described above, in the present embodiment, the first wiring substrate 1 can be mounted on the panel PNL before the first wiring substrate 1 is coupled to the second wiring substrate 2. Therefore, as compared with a case where the first wiring substrate 1 is mounted on the panel PNL after the first wiring substrate 1 is coupled to the second wiring substrate 2, the first wiring substrate 1 can be easily mounted on the panel PNL.

After that, the IC card CA is completed, and the manufacturing of the IC card CA ends.

Also in the third embodiment configured as described above, effects similar to those of the first embodiment can be obtained. In the third embodiment, the first wiring substrate 1 can be easily mounted on the panel PNL. In addition, the sensor SE can be tested before the IC card CA is completed.

Fourth Embodiment

Figure 22:
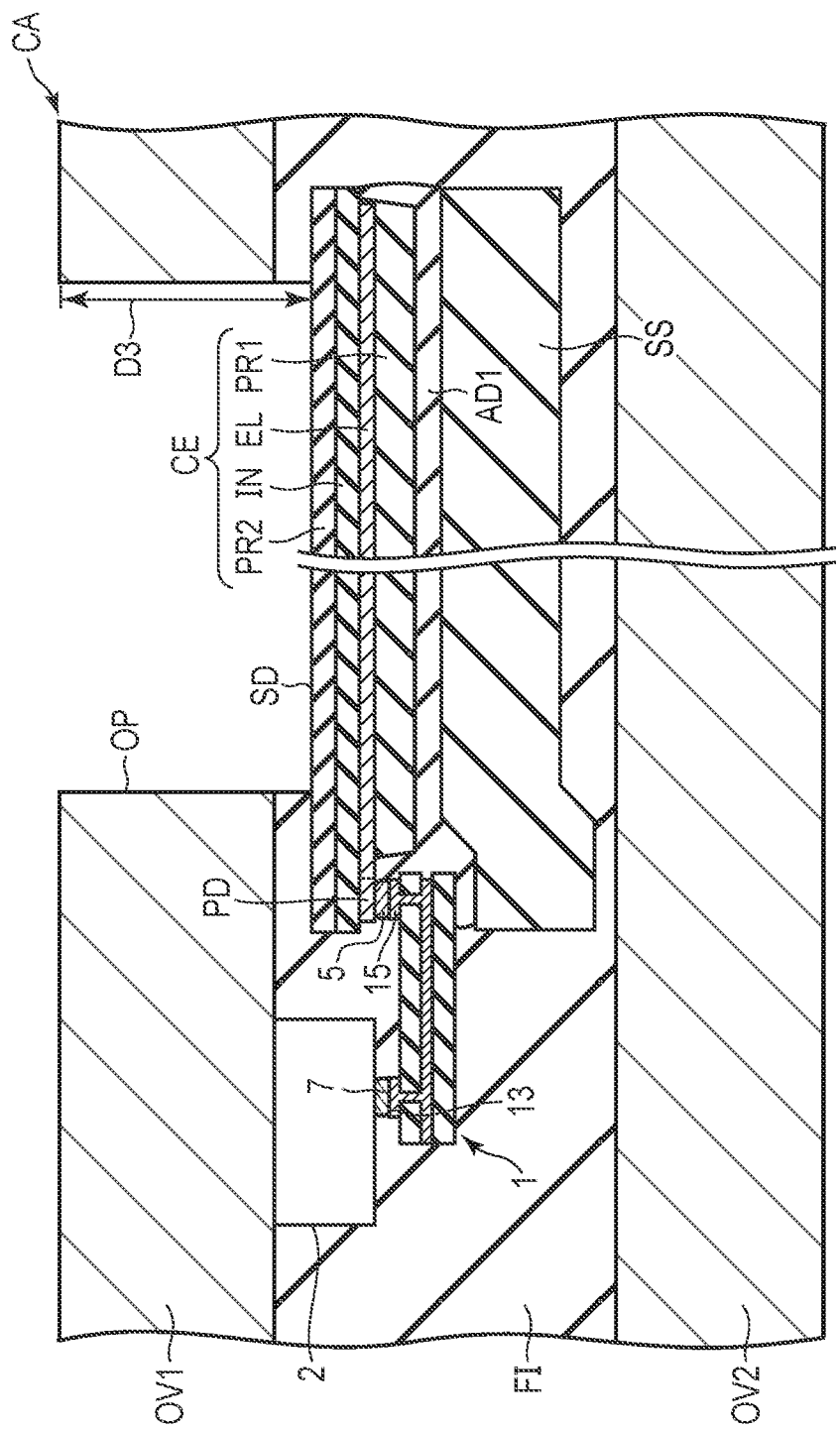
FIG. 22 is a cross-sectional view showing an IC card according to the fourth embodiment.

Next, a sensor-equipped device according to the fourth embodiment will be explained. Here, the IC card CA will be explained as an example of the sensor-equipped device. FIG. 22 is a cross-sectional view showing the IC card CA according to the fourth embodiment.

As shown in FIG. 22, the IC card CA of the present embodiment is configured similarly to the IC card of the third embodiment except for using the sensor of the second embodiment as the sensor SE.

Also in the fourth embodiment configured as described above, effects similar to those of the third embodiment can be obtained. In the fourth embodiment, since the first wiring substrate 1 does not project toward the detection surface SD, the gap between the overlay sheet OV1 and the detection surface SD can be reduced, and a distance D3 from an end of the opening OP on an outer surface side of the overlay sheet OV1 to the detection surface SD can be further reduced. Accordingly, the thinning of the IC card CA can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. If necessary, the embodiments can be combined together.

Figure 23:
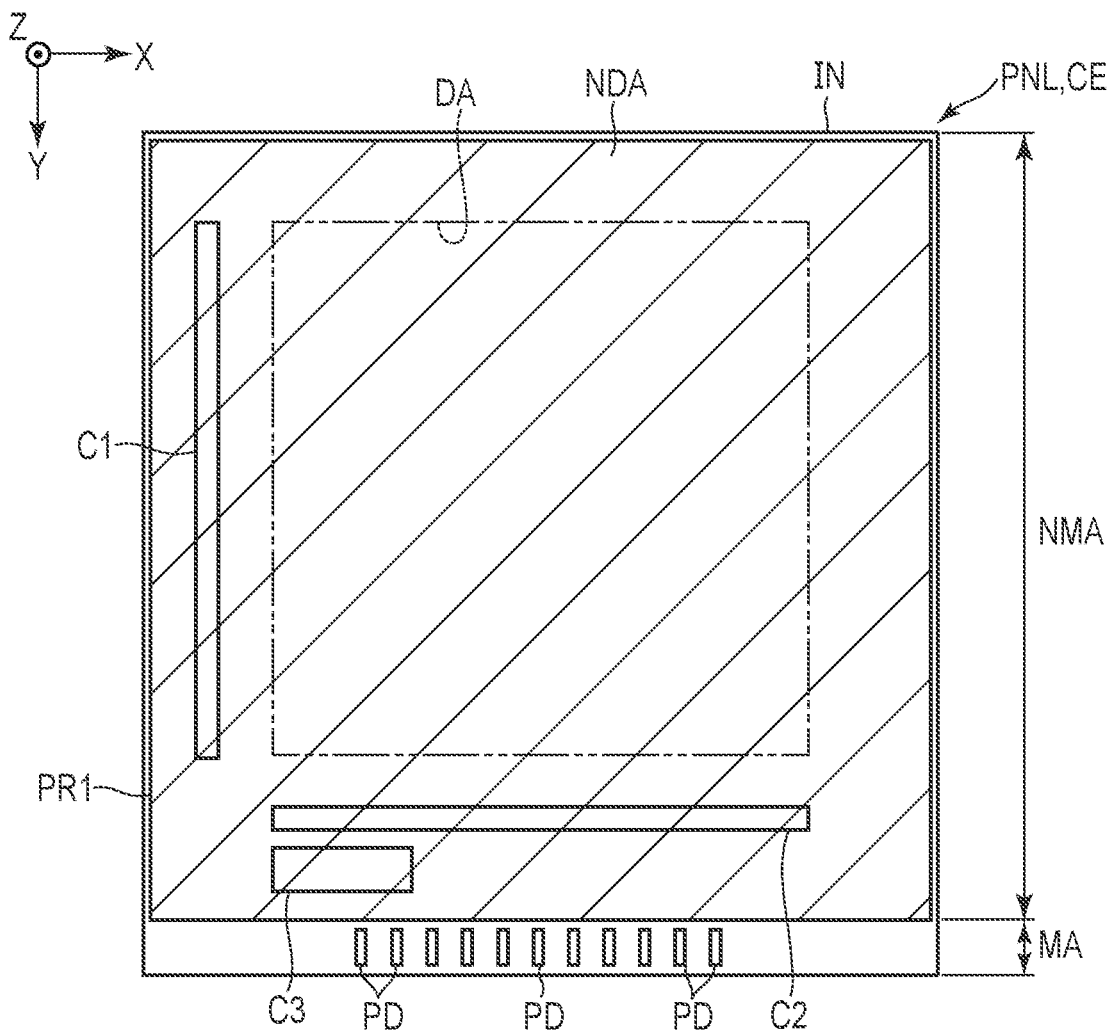

For example, as shown in FIG. 23, the first protective layer PR1 may be arranged in the non-mounting area NMA but may not be arranged in the mounting area MA. In the drawings, hatch lines are added to the first protective layer PR1. Accordingly, it is possible to avoid a situation where the first wiring substrate 1 interferes with the first protective layer PR1 while the first wiring substrate 1 is mounted on the cell CE.

What is claimed is:
1. A sensor comprising:
a panel which includes a cell having a detection surface and a non-detection surface opposed to the detection surface and a support substrate formed of resin and bonded to the non-detection surface of the cell; and
a first wiring substrate,
wherein
the cell includes an insulating substrate formed of resin and having a first surface and a second surface opposed to the first surface, a mounting area in which the first wiring substrate is mounted, a non-mounting area including a detection area and a non-detection area outside the detection area, a first protective layer facing the second surface of the insulating substrate, and formed in the non-mounting area, a sensor electrode disposed between the insulating substrate and the first protective layer and formed in the detection area, a circuit including a switching element electrically connected to the sensor electrode and formed in the non-detection area, and a shield electrode located between the insulating substrate and the first protective layer and formed in the non-detection area,
the circuit is located between the insulating substrate and the shield electrode, and is electrically shielded by the shield electrode,
the shield electrode is formed of a same material as the sensor electrode, and a thickness of the support substrate is greater than a thickness of the insulating substrate, and is greater than a thickness of the first protective layer.

2. The sensor of claim 1, wherein
the support substrate has a third surface facing the cell and a fourth surface opposed to the third surface, and
a first distance from the sensor electrode to the detection surface is less than a second distance from the sensor electrode to the fourth surface.

3. The sensor of claim 1,
wherein
the cell includes a linear boundary between the mounting area and the non-mounting area,
the first protective layer is not arranged in the mounting area, and
the first wiring substrate has a first end surface facing the first protective layer.

4. The sensor of claim 3, wherein
the first wiring substrate includes a core layer and a connection line arranged on the core layer, and extends from the first end surface to a second end surface, and
the connection line is exposed at the second end surface.

5. The sensor of claim 1, wherein
in the cell,
the insulating substrate is located closer to the non-detection surface than the sensor electrode, and
the first protective layer is located closer to the detection surface than the sensor electrode.

6. The sensor of claim 1, wherein
in the cell,
the first protective layer is located closer to the non-detection surface than the sensor electrode, and
the insulating substrate is located closer to the detection surface than the sensor electrode.

7. The sensor of claim 6, wherein
the cell further includes a second protective layer located closer to the detection surface than the insulating substrate.

8. The sensor of claim 6,
wherein
the cell includes a linear boundary between the mounting area and the non-mounting area,
the first protective layer is not arranged in the mounting area,
the first wiring substrate has a first end surface facing the first protective layer, and
the support substrate and the mounting area of the cell sandwich the first wiring substrate and physically fix the first wiring substrate.

9. The sensor of claim 1, further comprising:
a first wiring substrate being a flexible substrate; and
an adhesive layer having a first area located between the cell and the support substrate and a second area located between the first wiring substrate and the support substrate,
wherein
the cell includes a pad,
the first wiring substrate includes a wiring line electrically connected to the pad, and
the adhesive layer bonds the cell and the support substrate together, and bonds the first wiring substrate and the support substrate together.

10. The sensor of claim 1, wherein
the support substrate is formed of polyethylene terephthalate or polyethylene naphthalate, and
the insulating substrate is formed of polyimide.

11. The sensor of claim 1, wherein
the thickness of the insulating substrate is greater than or equal to 5 μm but less than or equal to 30 μm,
the thickness of the first protective layer is greater than or equal to 5 μm but less than or equal to 200 μm, and
the thickness of the support substrate is less than or equal to 300 μm.

12. A sensor-equipped device comprising:
a sensor comprising a panel which includes a cell having a detection surface and a non-detection surface opposed to the detection surface and a support substrate formed of resin and bonded to the non-detection surface of the cell, and a first wiring substrate which is coupled to the cell;
a second wiring substrate coupled to the first wiring substrate; and
a controller coupled to the second wiring substrate,
wherein
the cell includes an insulating substrate formed of resin and having a first surface and a second surface opposed to the first surface, a mounting area in which the first wiring substrate is mounted, a non-mounting area including a detection area and a non-detection area outside the detection area, a first protective layer facing the second surface of the insulating substrate and formed in the non-mounting area, a sensor electrode disposed between the insulating substrate and the first protective layer and formed in the detection area, a circuit including a switching element electrically connected to the sensor electrode and formed in the non-detection area, and a shield electrode located between the insulating substrate and the first protective layer and formed in the non-detection area,
the circuit is located between the insulating substrate and the shield electrode, and is electrically shielded by the shield electrode,
the shield electrode is formed of a same material as the sensor electrode,
the first wiring substrate includes a core layer and a connection line arranged on the core layer, and extends from a first end surface to a second end surface, the first end surface located at a cell side, the second end surface located at a second wiring substrate side,
a thickness of the support substrate is greater than a thickness of the insulating substrate, and is greater than a thickness of the first protective layer, and
the connection line is exposed at the second end surface.

13. The sensor-equipped device of claim 12, wherein
the support substrate has a third surface facing the cell and a fourth surface opposed to the third surface, and
a first distance from the sensor electrode to the detection surface is less than a second distance from the sensor electrode to the fourth surface.

14. The sensor-equipped device of claim 12, wherein
the cell includes a linear boundary between the mounting area and the non-mounting area,
the first protective layer is not arranged in the mounting area, and
the first wiring substrate has a first end surface facing the first protective layer.

15. The sensor-equipped device of claim 12, wherein
in the cell,
the insulating substrate is located closer to the non-detection surface than the sensor electrode, and
the first protective layer is located closer to the detection surface than the sensor electrode.

16. The sensor-equipped device of claim 12, wherein in the cell,
the first protective layer is located closer to the non-detection surface than the sensor electrode, and
the insulating substrate is located closer to the detection surface than the sensor electrode.

17. The sensor-equipped device of claim 12, further comprising
an adhesive layer including a first area located between the cell and the support substrate and a second area located between the first wiring substrate and the support substrate,
wherein
the cell includes a pad,
the first wiring substrate is a flexible substrate and includes a wiring line electrically connected to the pad, and
the adhesive layer bonds the cell and the support substrate together, and bonds the first wiring substrate and the support substrate together.

18. The sensor-equipped device of claim 12, wherein
the support substrate is formed of polyethylene terephthalate or polyethylene naphthalate, and
the insulating substrate is formed of polyimide.

* * * * *